United States Patent
Hsu et al.

(10) Patent No.: US 6,781,892 B2
(45) Date of Patent: Aug. 24, 2004

(54) ACTIVE LEAKAGE CONTROL IN SINGLE-ENDED FULL-SWING CACHES

(75) Inventors: Steven K. Hsu, Lake Oswego, OR (US); Sanu K. Mathew, Hillsboro, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/033,337

(22) Filed: Dec. 26, 2001

(65) Prior Publication Data

US 2003/0117859 A1 Jun. 26, 2003

(51) Int. Cl.[7] .................................................. G11C 7/00
(52) U.S. Cl. ........................ 365/189.11; 365/185.11; 365/185.17; 365/185.24; 365/154; 365/203; 365/226; 365/227
(58) Field of Search ....................... 365/189.11, 185.11, 365/185.17, 185.24, 185.25, 154, 203, 226, 227

(56) References Cited

U.S. PATENT DOCUMENTS

| | | | |
|---|---|---|---|
| 5,128,896 A | | 7/1992 | Yamada et al. |
| 5,357,468 A | | 10/1994 | Satani et al. |
| 5,862,099 A | * | 1/1999 | Gannage et al. ......... 365/238.5 |
| 6,025,741 A | * | 2/2000 | Ciraula et al. ................. 326/93 |
| 6,054,730 A | * | 4/2000 | Noguchi ..................... 257/306 |
| 6,339,358 B1 | * | 1/2002 | Horiguchi et al. .......... 327/544 |
| 6,404,236 B1 | * | 6/2002 | Bernstein et al. ............. 326/98 |
| 6,433,587 B1 | * | 8/2002 | Assaderaghi et al. ......... 326/95 |

* cited by examiner

Primary Examiner—Connie C. Yoha
(74) Attorney, Agent, or Firm—Seth Z. Kalson (57) ABSTRACT

A single-ended, full-swing dynamic cache having memory cells grouped into memory groups, where for each memory group one or more foot transistors connect to various memory cells within the memory group. Using a foot transistor reduces sub-threshold leakage current when the memory cells connected to the foot transistor are not being read.

18 Claims, 6 Drawing Sheets

ACTIVE LEAKAGE CONTROL IN SINGLE-ENDED FULL-SWING CACHES

FIELD

Embodiments of the present invention relate to memory circuits, and more particularly, to caches.

BACKGROUND

Figure 1:
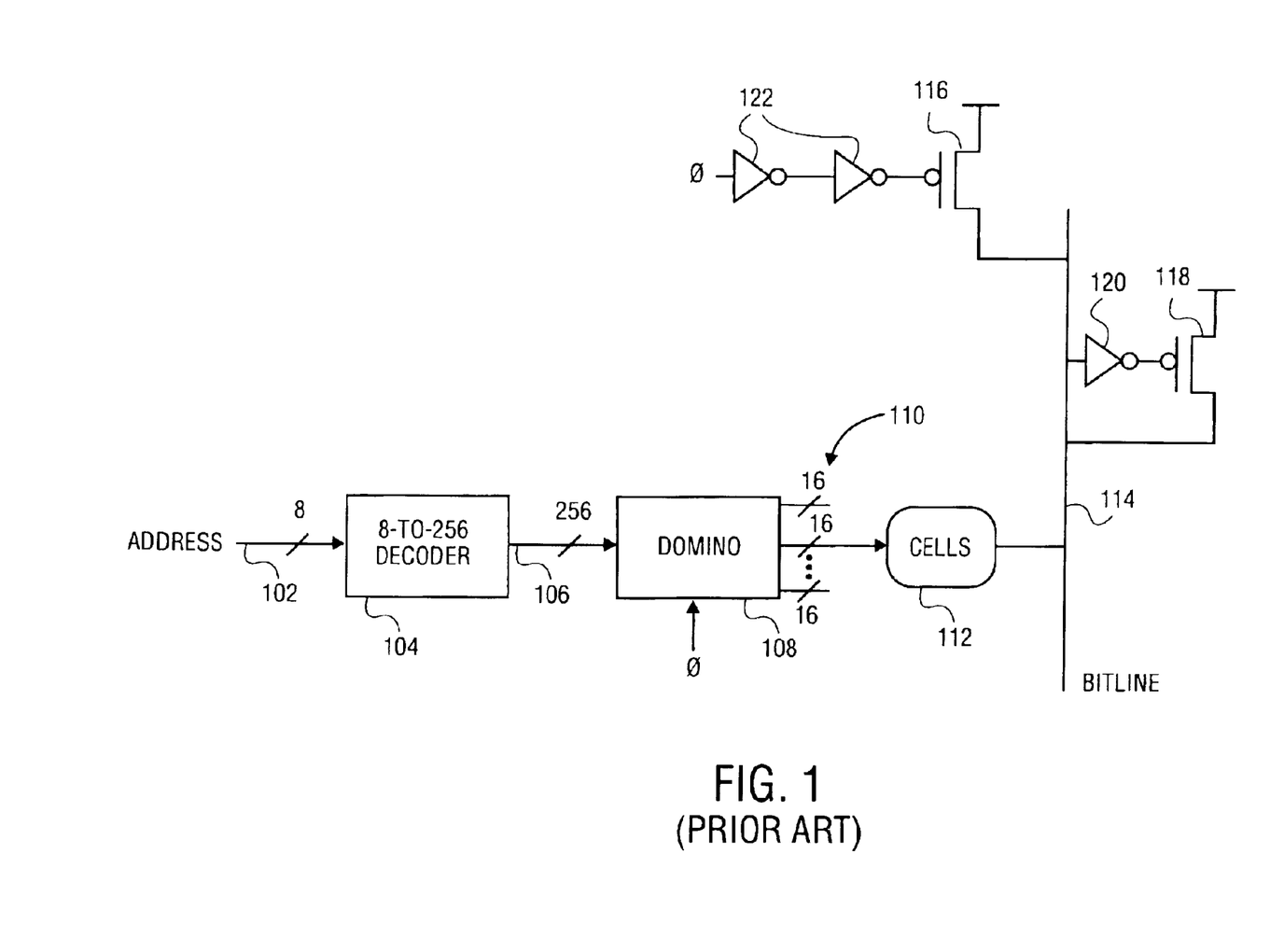
FIG. 1 is a prior art cache.

A cache is high-speed memory. To achieve high-speed performance, caches often employ dynamic (domino) logic. A high-level abstraction of a dynamic cache is provided in FIG. 1. The cache in FIG. 1 is addressable memory, where an address is provided on ports 102 to access one or more bits of information associated with the address. The cache shown in FIG. 1 may be part of a larger memory system, such as for example a content addressable memory system, where the address on ports 102 is obtained after tag matching.

The address on ports 102 is decoded by decoder 104. In the particular example of FIG. 1, the address on ports 102 is 8 bits wide, so that decoder 104 is an 8-to-256 bit decoder. There are 256 ports, labeled ports 106. One of ports 106 is asserted HIGH, and the other remaining ports 106 are LOW, corresponding to the decoded 8 bit address at ports 102. The signals on ports 106 are static in the sense that any port belonging to the set of ports 106 is held at a constant logical value (either HIGH or LOW) while an address is provided on port 102.

Domino gate 108 provides dynamic (domino) compatible signals at its output ports 110, indicative of the static signals on ports 106. The signals on ports 110 are read-select signals, where a HIGH logical value indicates a read operation. Domino gate 108 is clocked by a clock signal, denoted by $\phi$, where $\phi$ is HIGH during an evaluation phase and is LOW during a pre-charge phase. Domino gate 108 may comprise simple dynamic buffers, such as two dynamic inverters in series for each input/output port pair, so that the output signals on output ports 110 are LOW during a pre-charge phase, and take on the same logical values as the corresponding input signals on input ports 106 during an evaluation phase.

Set of memory cells 112 represents a set of memory cells, each memory cell sharing local bit line 114. In the particular example of FIG. 1, set of memory cells 112 comprises 16 memory cells. Local bit line 114 is pulled HIGH by pullup pMOSFET 116 during a pre-charge phase, and a half-keeper comprising pMOSFET 118 and inverter 120 keeps bit line 114 HIGH during an evaluation phase unless it is otherwise pulled LOW by one of the memory cells in set of memory cells 112. For simplicity, only one set of memory cells with the corresponding local bit line are shown. For example, for the dynamic cache shown in FIG. 1, there will be 16 such sets of memory cells and local bit lines, each set of memory cells comprising 16 memory cells, for a total plurality of 256 memory cells.

Note that the roles of HIGH and LOW may be interchanged in the previous description regarding decoder 104. That is, one of ports 106 may be asserted LOW, where the other remaining ports are HIGH. In that case, domino gate 108 need only comprise one inverter for each input/output port pair, so that a read-select signal on one of ports 110 is HIGH for a read operation.

Figure 2:
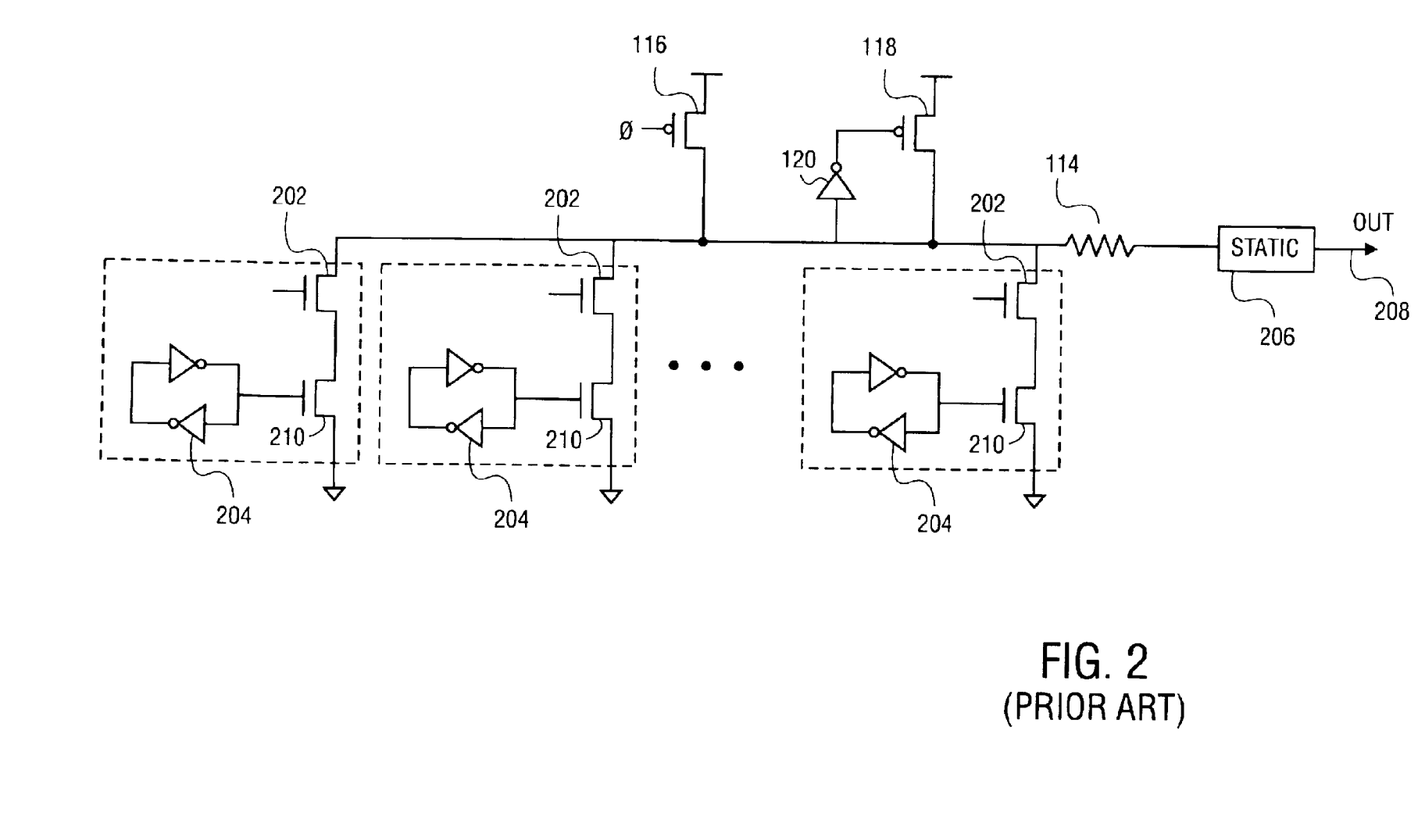
FIG. 2 illustrates a portion of the prior art cache of FIG. 1.

An example of a set of memory cells sharing the same local bit line is provided in FIG. 2. For simplicity, FIG. 2 shows only that portion of a set of memory cells relevant to the present description. The gates of read-access transistors 202 are connected to the appropriate read-select ports 110 so as to receive the appropriate read-select signals. A typical memory cell 204 comprises cross-coupled inverters and a read-pass nMOSFET 210. Not shown are the ports required for writing data into a memory cell. Note that in FIG. 1, clock signal $\phi$ is buffered by inverters 122 before being applied to the gate of pullup pMOSFET 116 to account for the delay due to domino gate 108. For simplicity, such inverters are omitted in FIG. 2, it being understood that a delay functional unit of some type may be needed in an actual circuit realization. Static unit 206 represents generic static logic, which may be inserted between domino circuit blocks of a larger circuit system, so that port 208 may be connected to other domino circuit blocks.

As device technology scales to smaller dimensions, sub-threshold leakage current may contribute to significant unwanted power dissipation in cache circuits, and may contribute to inaccurate readings of memory cells. For example, consider the case in which all memory cells in FIG. 2 are in a logical state such that the gates of read-pass transistors 210 are HIGH. During a pre-charge phase, bit line 114 will be charged HIGH and all read-access transistors 202 will be OFF. Nevertheless, the additive effect of sub-threshold leakage current in all read-access transistors 202 may cause significant current flow from bit line 114 at the HIGH potential to ground at the LOW potential, thereby wasting power.

Furthermore, consider another case in which all memory cells in FIG. 2 are in a logical state such that the gates of all read-pass transistors 210 are LOW. If during an evaluation phase a read operation is performed on one of the memory cells, the sub-threshold leakage current in the read-pass transistor in the memory cell being read may cause bit line 114 to discharge to a sufficiently low potential such that an incorrect read operation occurs.

DESCRIPTION OF EMBODIMENTS

Figure 3:
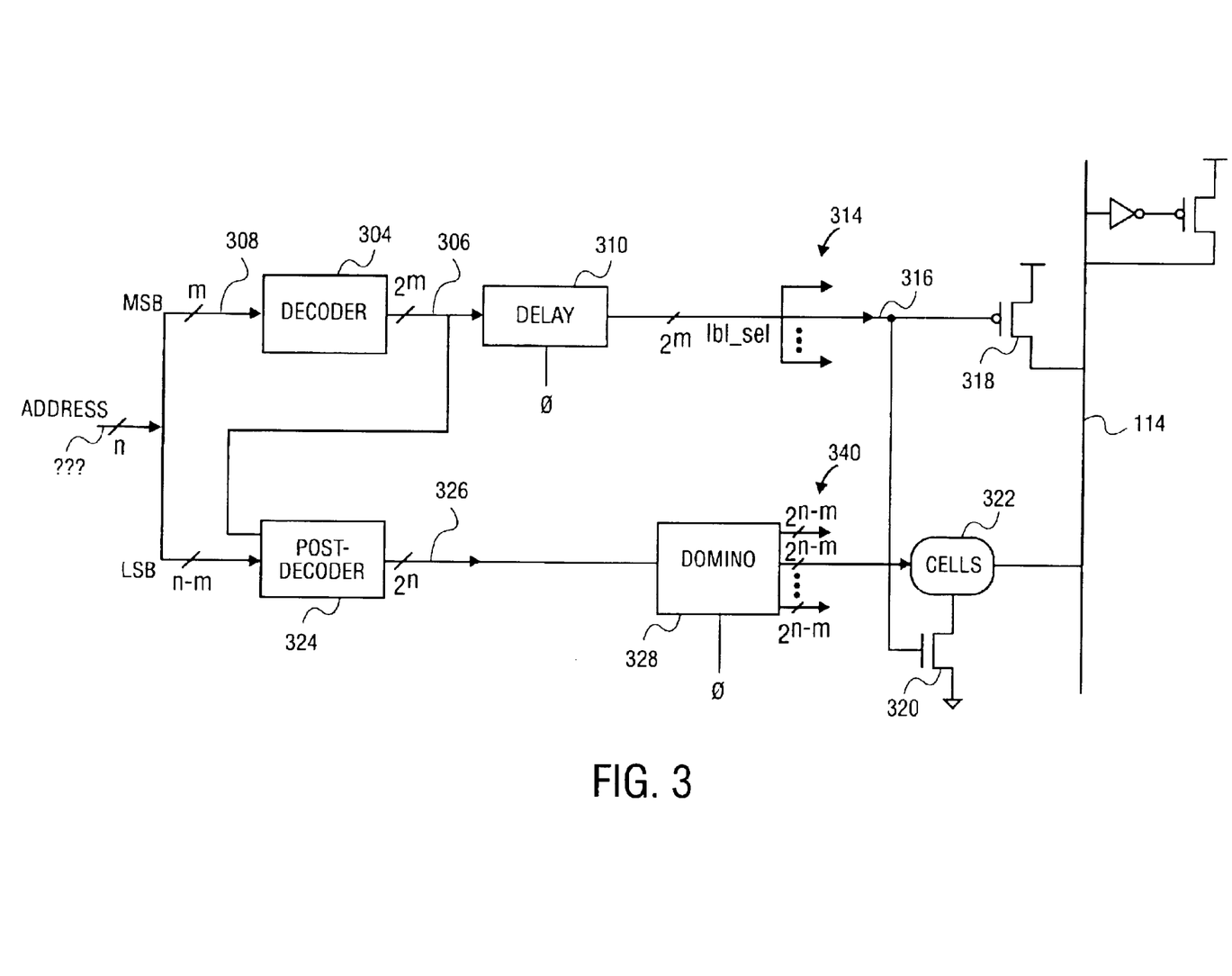
FIG. 3 is an embodiment according to the present invention.

An embodiment of the present invention is abstracted in FIG. 3. An n-bit address is provided at port 302, where m most significant bits are provided to decoder 304. Decoder 304 provides static signals at output ports 306, representing the decoding of the m bits provided at input ports 308. There are $2^m$ ports in the plurality of output ports 306. After being delayed by delay unit 310, the $2^m$ static signals representing the decoding of the m most significant address bits are used to drive the gates of the pullup pMOSFETs coupled to the local bit lines, one static signal for each pullup pMOSFET. These signals are referred to as local bit line select (lbl_sel) signals, and their respective ports are referred to as local bit line select ports. In the example of FIG. 3, local bit line select port 316 is connected to the gate of pullup pMOSFET 318. Local bit line select port 316 is also connected to the gate of foot transistor 320. The function of foot transistor 320 will be described in more detail later. In the embodiment of FIG. 3, there are pluralities of $2^m$ local bit lines, $2^m$ pullup pMOSFETs, and $2^m$ foot transistors.

The lower (least significant) (n−m) bits of the n-bit address are provided to post-decoder 324, and the output of decoder 304 is also provided to post-decoder 324, so that the signals on output ports 326 decode the entire n-bit address. In another embodiment, the entire n-bit address is provided to a decoder to provide the signals on ports 326. However, a savings in circuit area may be realized by the using a post-decoder as indicated in FIG. 3. There are $2^n$ ports in the plurality of output ports 326.

The static signals from post-decoder 324 (or a full decoder if so used) are provided to domino gate 328 so as to be converted into dynamic (domino) read-select signals. Delay unit 310 is introduced to synchronize the local bit line select signals with the dynamic read-select signals. The plurality of $2^n$ output ports (read-select ports 340) of domino gate 328 are grouped into $2^m$ sets of read-select ports, each set having $2^{n-m}$ read-select ports. There are $2^m$ sets of memory cells, one for each set of read-select ports. Each set of memory cells has $2^{n-m}$ memory cells, one for each read-select port in the corresponding set of read-select ports. There is a plurality of $2^n$ memory cells. In the example of FIG. 3, one of the $2^m$ sets of read-select ports 340 is coupled to set of memory cells 322 so as to implement a read operations on set of memory cells 322.

The $2^m$ local bit lines, $2^m$ pullup pMOSFETs, $2^m$ foot transistors, and $2^m$ sets of memory cells may be considered as belonging to groups, where a group has one set of memory cells, one foot transistor, one pullup pMOSFET, and one local bit line. A group comprises other components, such as a half-keeper connected to the group's local bit line. Such groups will be referred to as memory groups. The components belonging to a memory group are coupled together as indicated in FIG. 3. There clearly are $2^m$ memory groups for the embodiment of FIG. 3.

Figure 4:
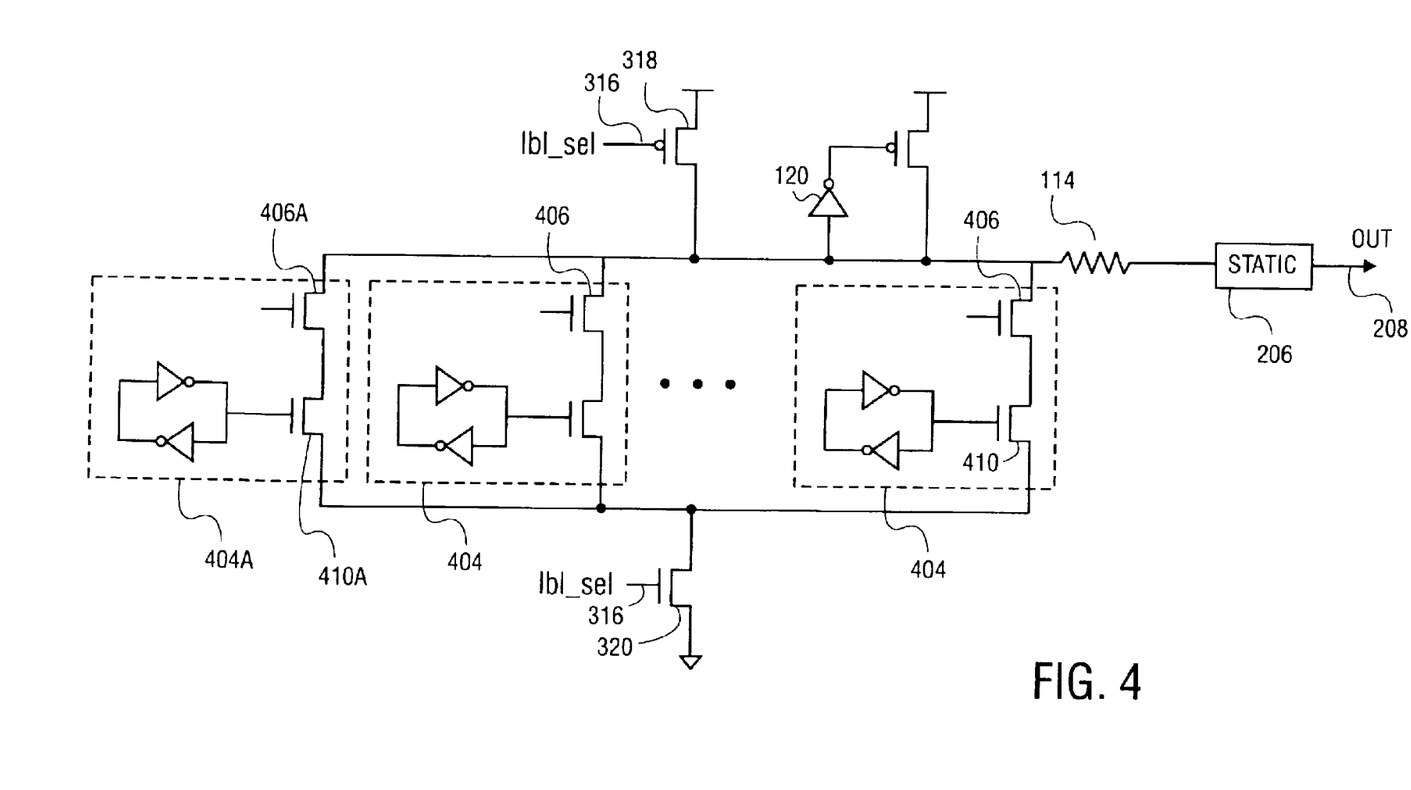
FIG. 4 illustrates a memory group belonging to the embodiment of FIG. 3.

The particular memory group comprising set of memory cells 322, pullup pMOSFET 318, foot transistor 320, and local bit line 114 is shown in FIG. 4. For simplicity, write ports and other features extraneous to understanding the present embodiments are not explicitly shown. As seen in FIG. 4, set of memory cells 322 of FIG. 3 includes individual memory cells 404, where read-access transistors 406 are coupled to read-select ports. During a pre-charge phase, the gates of read-access transistors 406 are held LOW. During an evaluation phase, one of the gates of read-access transistors 406 may be brought HIGH if the corresponding memory cell is to be read.

Referring to FIG. 4, local bit line select port 316 is held HIGH if one of memory cells 404 is to be read, otherwise, it is held LOW. More generally stated, for each memory group, the local bit line select port coupled to a memory group is held HIGH if one of the memory cells in that memory group is to be read, otherwise, the local bit line select port is held LOW. Because there are $2^m$ sets of read-select ports, a one-to-one correspondence may be made between the $2^m$ local bit line select ports and the $2^m$ sets of read-select ports such that a local bit line select port is HIGH if and only if a read-select port in the corresponding set of read-select ports is HIGH during an evaluation phase.

If a memory cell belonging to a memory group is to be read, then the corresponding local bit line select port is HIGH, so that the corresponding pullup pMOSFET is OFF and the corresponding foot transistor is ON. In this way, the memory group's local bit line will be discharged LOW if the memory cell to be read stores a logical state such that the gate of the corresponding read-pass transistor is HIGH (e.g., MOSFET 410a is the read-pass transistor for memory cell 404a), otherwise, the half-keeper connected to the memory group's local bit line will maintain the local bit line in a charged HIGH state.

If, however, none of the memory cells in a memory group are to be read, then the corresponding local bit line select port is LOW, so that the corresponding pullup pMOSFET is ON and the corresponding foot transistor is OFF. The pullup pMOSFET keeps the local bit line held HIGH. With the foot transistor OFF, sub-threshold leakage current is reduced by the stack effect.

For example, consider the case in which none of the memory cells in FIG. 4 are to be read. Then the local bit line select port 316 is LOW, and consequently pullup pMOSFET 318 is ON and foot transistor 320 is OFF. Suppose memory cell 404a stores a logical state such that the voltage potential of the gate of read-pass transistor 410a is LOW. If sub-threshold current were to flow through nMOSFET 410a and to ground via foot transistor 320, then the voltage potential of the drain of foot transistor 316 would rise above the ground potential (LOW). Consequently, with the drain of foot transistor 316 connected to the source of read-pass transistor 410a, this would cause the voltage potential of the source of read-pass transistor 410a to rise above LOW, and read-pass transistor 410a would be reverse biased because its gate-to-source voltage difference would be negative. Read-pass transistor 410a is thus strongly turned OFF, resulting in a significant reduction in sub-threshold leakage current. This effect of reducing sub-threshold leakage current by connecting two nMOSFETs in series, where the gates are LOW, is known as the stack effect.

Continuing with the above example, suppose the logical state of memory cell 404a is such that the voltage potential of the gate of read-pass transistor 410a is HIGH. The voltage potential of the gate of read-access transistor 406a is LOW because it has been assumed in this particular case that none of the memory cells are to be read, that is, all read-select signals provided to the memory group are LOW. Then, read-access transistor 406a together with foot transistor 320 realize the stack effect, so that sub-threshold leakage current is again significantly reduced.

It is seen that when no read operation is being performed on a memory cell, either the combination of the corresponding foot transistor and read-access transistor, or the combination of the corresponding foot transistor and read-pass transistor, realize a stack effect. Consequently, the use of a foot transistor in a memory group reduces sub-threshold leakage current due to the stack effect, regardless of the stored state of the memory cell, provided a read operation is not performed.

After a memory cell is read, the corresponding local bit line may be discharged LOW, depending upon the logical state of the memory cell. Consequently, after a read operation is performed during an evaluation phase, in the immediately following pre-charge phase the corresponding local bit line should be charged HIGH if it had been discharged LOW so that a subsequent read operation during the next evaluation phase to the same or other memory cell within the corresponding memory group will provide the correct result. This may be accomplished by gating delay unit 310 by the clock signal φ as indicated in FIG. 3, so that during a pre-charge phase when φ is LOW, the local bit line select ports are LOW. This gating may be performed in another part of the signal path, such as decoder 304.

Figure 5:
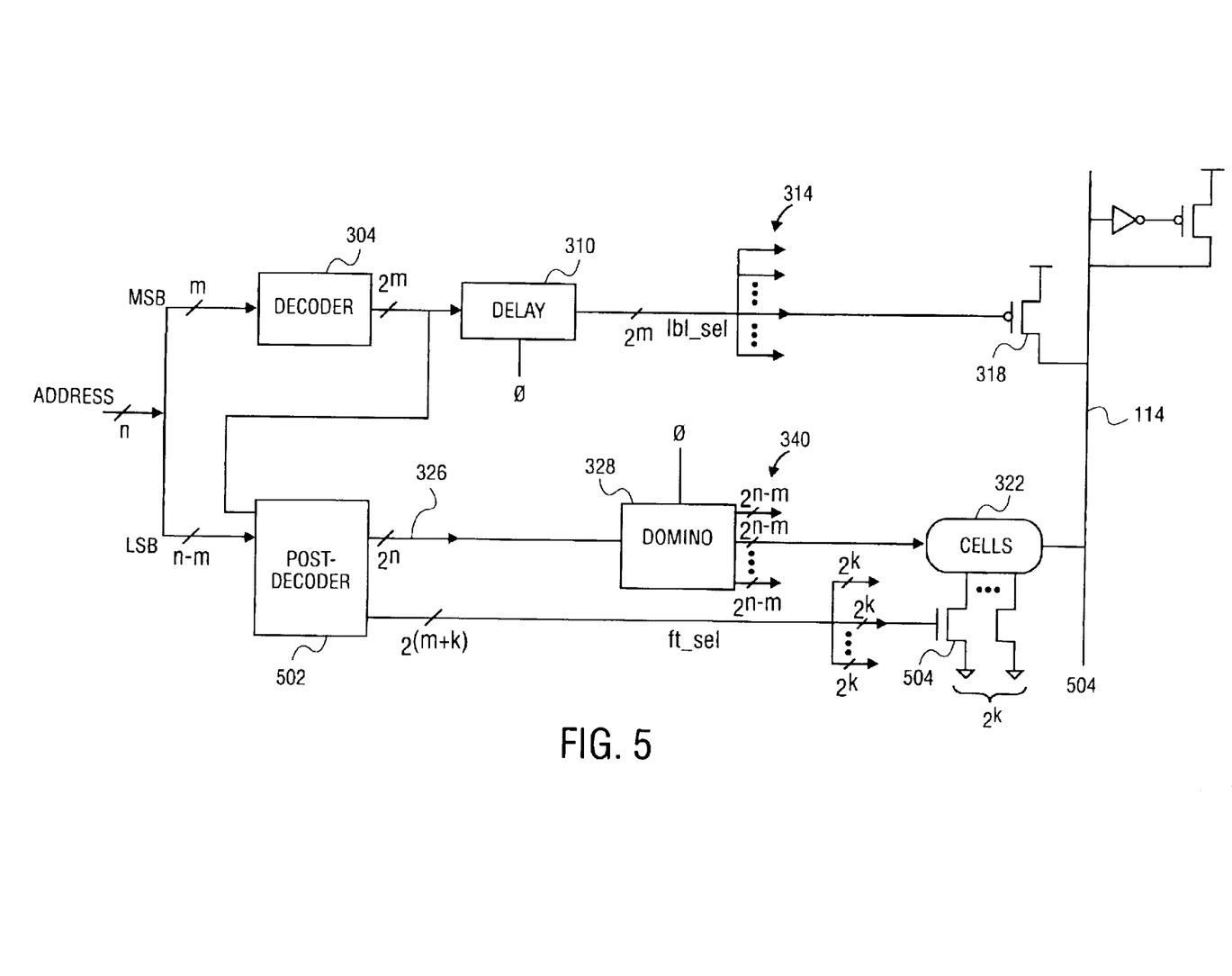
FIG. 5 is another embodiment of the present invention utilizing multiple foot transistors for each memory group.

Another embodiment is abstracted in FIG. 5, where components in FIG. 5 operate in the same fashion as correspondingly labeled components in FIG. 3. As before, the m most significant bits of the n-bit address are decoded into $2^m$ local bit line select signals, and the entire n-bit address is decoded into $2^n$ read-select signals grouped into $2^m$ sets where each set has $2^{n-m}$ read-select signals. Also, as before, there are $2^m$ memory groups where each memory group has $2^{n-m}$ memory cells connected to the $2^{n-m}$ read-select ports of one of the $2^m$ sets of read-select ports 340, and there is a one-to-one correspondence between the $2^m$ local bit line ports and the $2^m$ sets of read-select ports such that a local bit line select port is HIGH if and only if a read-select port in the corresponding set of read-select ports is HIGH. However, note that for the embodiment of FIG. 5, the local bit line select ports do not connect directly to the foot transistors.

Post-decoder 502, in addition to effectively decoding all n bits of the n-bit address, also decodes the m+k most significant bits of the n-bit address, where m+k≦n, to provide $2^{m+k}$ signals on $2^{m+k}$ ports 506, referred to respectively as foot transistor select (ft_sel) signals and foot transistor select ports. These $2^{m+k}$ foot transistor select ports are grouped into $2^m$ sets of foot transistor select ports, each set having $2^k$ foot transistor select ports. There is a one-to-one correspondence between the $2^m$ local bit line select ports and the $2^m$ sets of foot transistor select ports, where a local bit line select port is HIGH if and only if a foot transistor select port in the corresponding subset of foot transistor select ports is HIGH.

Consequently, corresponding to every memory group is a local bit line select port, a set of read-select ports, and a set of foot transistor select ports. If the local bit line select port to a memory group is HIGH, then during an evaluation phase there is one foot transistor select port to the memory group that is HIGH and one read-select port to the memory group that is HIGH. If the local bit line select port to a memory group is LOW, then during an evaluation phase all foot transistor select ports to the memory group are LOW and all read-select ports to the memory group are LOW.

Each memory group has $2^k$ foot transistors, where the gate of each foot transistor in a memory group is connected to one of the $2^k$ foot transistor select ports in the corresponding set of foot transistor ports. For each memory group, the set of memory cells are grouped into $2^k$ subsets of memory cells, were each subset of memory cells is connected to one of the $2^k$ foot transistors. Each subset of memory cells has $2^{n-m-k}$ memory cells. Accordingly, the $2^{n-m}$ read-select ports corresponding to each memory group may be viewed as grouped into $2^k$ subsets, each subset having $2^{n-m-k}$ read-select ports, where each subset of read-select ports is in one-to-one correspondence with each subset of memory cells. Furthermore, the read-select ports and foot transistors are connected to the memory cells such that if all the memory cells in a subset of memory cells are not to be read, then the corresponding foot transistor is OFF, and if one of the memory cells in a subset of memory cells is to be read, then the corresponding foot transistor is ON.

Note that there are $2^{m+k}$ foot transistors for the embodiment of FIG. 5, whereas there are $2^m$ foot transistors for the embodiment of FIG. 3. The number local bit lines, pullup transistors, memory cells in the two embodiments are the same for equal n and m. The embodiment of FIG. 5 essentially reduces to that of FIG. 4 for the special case in which k=0.

Figure 6:
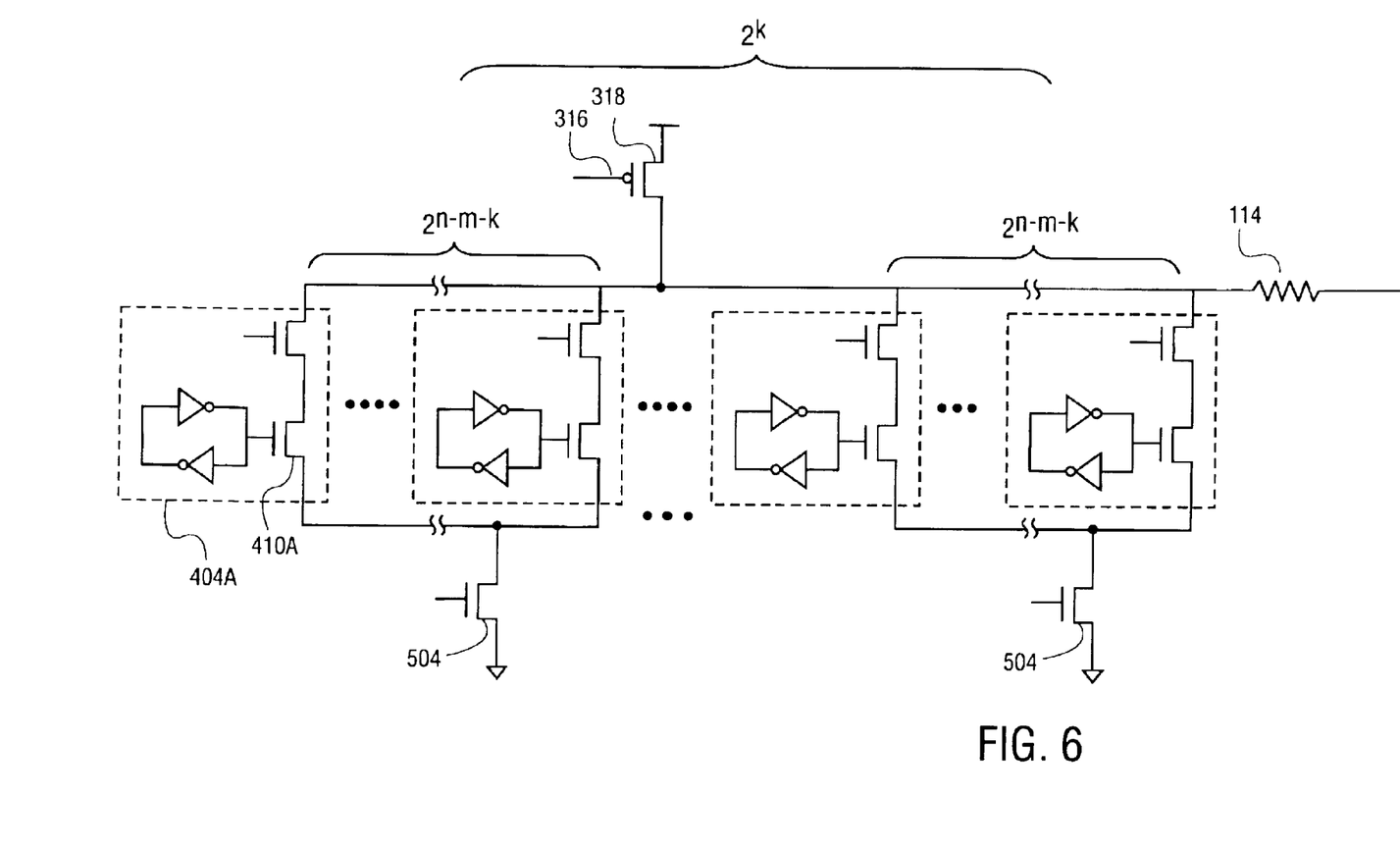
FIG. 6 illustrates a memory group belonging to the embodiment of FIG. 5.

The memory group in FIG. 5 comprising set of memory cells 322, pullup pMOSFET 318, and foot transistors 504 is shown in FIG. 6, where for simplicity the half-keeper and write ports are not shown. The operation of the memory group in FIG. 6 is similar to that of FIG. 4, and many of the details need not be repeated. However, because there are now only $2^{n-m-k}$ memory cells connected to any one foot transistor, the cache of FIG. 5 should be more robust than that of FIG. 3 for the same size n and m. This is seen by observing that during a read operation in a memory group, only one of the foot transistors in the memory group is ON, the others being OFF. For those memory cells connected to the OFF foot transistors, the stack effect significantly reduces sub-threshold leakage current. For the memory cells connected to the ON foot transistor, the stack effect is not present. But there are now only $2^{n-m-k}$ memory cells connected to the ON foot transistor. Consequently, if the memory cell to be read has a stored logical state such that the corresponding read-pass transistor is OFF, then with only $2^{n-m-k}$ memory cells connected to the ON foot transistor, there is less sub-threshold leakage current than for the structure of FIG. 4 (for the same process technology and transistor size), and consequently the local bit line is less likely to discharge LOW and provide an incorrect read.

Various modifications may be made to the disclosed embodiments without departing from the scope of the invention as claimed below. For example, the pullup pMOSFETs for the local bit lines may be clocked as in FIG. 1 instead of driven by the local bit line select signals, where the foot transistors are still controlled by the local bit line select signals as in FIG. 3 or the foot transistor select signals as in FIG. 5. However, using static signals to drive the pullup pMOSFETs may be advantageous in that the clocking distribution network is reduced, thereby leading to a savings in power dissipation. Furthermore, embodiments using static signals to maintain the local bit lines in their charged states may be more robust than using dynamic signals where a half-keeper maintains the local bit lines HIGH during the evaluation phases (unless one is pulled LOW during a read operation).

Furthermore, other embodiments may be realized in which the various subsets of memory cells within a memory group need not be the same size. Also, it is not necessary that the various described sets and subsets be powers of two. Furthermore, it is not necessary that the memory groups be of the same size. However, embodiments in which the various sets and subsets are powers of two, and for which each memory group is of the same size and each subset of memory cells within a memory group is of the same size, may be easier to implement than other embodiments.

It is immaterial to the claimed scope of the invention as to how the various decoders and or post-decoders are implemented, and whether post-decoders are utilized at all. For example, in FIG. 5, two decoders may be substituted for post-decoder 502 (the feedback from decoder 304 to post-decoder 502 is eliminated), where one decoder decodes the entire n-bit address to provide the $2^n$ read-select signals, and the other decoder decodes the least significant n−m bits of the n-bit address to provide the $2^{m+k}$ foot transistor select signals. Consequently, it is to be understood that the term "decoder" encompasses not just a single decoder, but perhaps one or more decoders, and perhaps one or more post-decoders, where the various decoders and post-decoders decode various bits of an address. It is also to be understood that a set of objects, such as a set of memory cells, may contain only one such object. A similar statement also applies to a subset of objects.

What is claimed is:

1. A memory device comprising:
   a set of memory cells to store data, each memory cell comprising a read-pass transistor, each read-pass transistor comprising a source and comprising a gate that is HIGH if its corresponding memory cell stores a first logical state and is LOW if the corresponding memory cell stores a second logical state; and
   a foot transistor comprising a drain connected to the source of each read-pass transistor, and comprising a ground-connected source, wherein the foot transistor is ON during a read operation on one of the memory cells, and wherein the foot transistor is OFF when no read operation is performed on any of the memory cells.

2. A memory device comprising a set of memory cells to store data and a foot transistor coupled to the set of memory cells, wherein each memory cell comprises:
   a read-access transistor;
   a read-select port to turn the read-access transistor ON during a read operation; and
   a read-pass transistor comprising a gate that is HIGH if the memory cell stores a first logical state, and that is LOW if the memory cell stores a second logical state;
   wherein the foot transistor is ON during a read operation on one of the memory cells, and wherein the foot transistor is OFF when no read operation is performed on any of the memory cells;
   wherein a subthreshold current in the read-access transistor flowing through the foot transistor causes the read-access transistor to be reverse biased if the memory cell stores the first logical state and the read-access transistor and the foot transistor are OFF; and
   wherein a subthreshold current in the read-pass transistor flowing through the foot transistor causes the read-pass transistor to be reverse biased if the memory cell stores the second logical state and the foot transistor is OFF.

3. The memory device as set forth in claim 2, further comprising:
   a bit line to read the data stored in the set of memory cells; and
   a pullup transistor to pull the bit line HIGH if ON, wherein the pullup transistor is OFF during a read operation on one of the memory cells.

4. A memory device, the memory device comprising:
   a bit line;
   a set of memory cells, each memory cell comprising:
      a read-pass transistor having a source and a drain;
      a read-access transistor having a drain connected to the bit line and a source connected to the drain of the read-pass transistor; and
   a foot transistor having a drain connected to the source of each read-pass transistor,
   wherein the foot transistor is ON during a read operation on one of the memory cells, and wherein the foot transistor is OFF when there is no read operation on any of the memory cells.

5. The memory device as set forth in claim 4, further comprising:
   a pullup pMOSFET to pull the bit line HIGH if ON, wherein the pullup pMOSFET is OFF during a read operation on one of the memory cells.

6. The memory device as set forth in claim 5, the memory device having an evaluation phase and a pre-charge phase such that a read operation is performed only during an evaluation phase, the memory device further comprising:
   a domino gate to turn OFF all the read-access transistors during a pre-charge phase, and during an evaluation phase to turn ON the read-access transistors belonging to those memory cells undergoing a read operation.

7. The memory device as set forth in claim 4, the memory device having an evaluation phase and a pre-charge phase such that a read operation is performed only during an evaluation phase, the memory device further comprising:
   a domino gate to turn OFF all the read-access transistor during a pre-charge phase, and during in evaluation phase to turn ON a read-select transistor if a read operation is performed on its memory cell.

8. A memory device comprising:
   a plurality of memory cells, each memory cell comprising a read-pass transistor having a source and a drain, and comprising a read-access transistor having a drain and having a source connected to the drain of the read-pass transistor; where the plurality of memory cells are grouped into sets of memory cells, where each set of memory cells is grouped into subsets of memory cells; and
   a plurality of foot transistors in one-to-one correspondence with the subsets of memory cells, each foot transistor having a drain connected to the source of each read-pass transistor in the corresponding subset of memory cells;
   wherein during a read operation on a particular memory cell belonging to a particular subset of memory cells belonging to a particular set of memory cells, the foot transistor belonging to the plurality of foot transistors which is connected to the read-pass transistors in the particular subset of memory cells is ON, where foot transistors belonging to the plurality of foot transistors are OFF if connected to a subset of memory cells in which no read operation is performed.

9. The memory device as set forth in claim 8, further comprising:
   a plurality of local bit lines in one-to-one correspondence with the sets of memory cells, where each local bit line is connected to the drain of each read-access transistor belonging to the corresponding set of memory cells; and
   a plurality of pullup transistors in one-to-one correspondence with the local bit lines, each pullup transistor having a drain connected to the corresponding local bit line;
   wherein during a read operation, the pullup transistor connected to the local bit line corresponding to the particular set of memory cells is OFF.

10. The memory device as set forth in claim 9, the memory device having an evaluation phase and a pre-charge phase such that a read operation is performed only during an evaluation phase, the memory device further comprising:
    a domino gate to turn OFF all the read-select transistors during a pre-charge phase, and during an evaluation phase to turn ON a read-access transistor if a read operation is performed on its memory cell.

11. The memory device as set forth in claim 8, the memory device having an evaluation phase and a pre-charge phase such that a read operation is performed only during an evaluation phase, the memory device further comprising:
    a domino gate to turn OFF all the read-access transistors during a pre-charge phase, and during an evaluation phase to turn ON a read-access transistor if a read operation is performed on its memory cell.

12. A memory device to read stored data addressable by an n-bit address, the memory device comprising:

a plurality of $2^n$ memory cells, each memory cell comprising a read-pass transistor having a source and a drain, and comprising a read-access transistor having a drain and having a source connected to the drain of the read-pass transistor; where the plurality of $2^n$ memory cells are grouped into $2^m$ sets of $2^{n-m}$ memory cells, where $0 \leq m \leq n$, where each set of $2^{n-m}$ memory cells is grouped into $2^k$ subsets of memory cells so that there are $2^{m+k}$ subsets of memory cells, where $0 \leq k \leq n-m$, each subset of memory cells having $2^{n-m-k}$ memory cells;

a plurality of $2^{m+k}$ foot transistors in one-to-one correspondence with the $2^{m+k}$ subsets of memory cells, each foot transistor having a drain connected to the source of each read-pass transistor in the corresponding subset of memory cells; and a decoder coupled to the pluralities of memory cells and foot transistors, such that during a read operation on a particular memory cell belonging to a particular subset of $2^{n-m-k}$ memory cells belonging to a particular set of $2^{n-m}$ memory cells, the foot transistor belonging to the plurality of $2^{m+k}$ foot transistors that is connected to the read-pass transistors in the particular subset of $2^{n-m-k}$ memory cells is ON, where those foot transistors belonging to the plurality of $2^{m+k}$ foot transistors that are connected to a subset of $2^{n-m-k}$ memory cells not being read are OFF.

13. The memory device as set forth in claim 12, further comprising:

a plurality of $2^m$ local bit lines in one-to-one correspondence with the $2^m$ sets of $2^{n-m}$ memory cells, where each local bit line is connected to the drain of each read-access transistor belonging to the corresponding set of $2^{n-m}$ memory cells; and a plurality of $2^m$ pullup transistors in one-to-one correspondence with the $2^{n-m}$ local bit lines, each pullup transistor having a drain connected to the corresponding local bit line;

wherein the decoder is coupled to the plurality of pullup transistors such that during a read operation on the particular memory cell, the pullup transistor connected to the local bit line corresponding to the particular set of $2^{n-m}$ memory cells is OFF.

14. The memory device as set forth in claim 13, wherein the decoder:

decodes the n bits of the n-bit address to provide $2^n$ read select signals in one-to-one correspondence with the plurality of memory cells so that each read select signal affects switching of the read-access transistor of the corresponding memory cell;

decodes the m most significant bits of the n-bit address to provide $2^m$ local bit line select signals in one-to-one correspondence with the plurality of $2^m$ pullup transistors so that each local bit line select signal affects switching of the corresponding pullup transistor; and decodes the m+k most significant bits of the n-bit address to provide $2^{m+k}$ foot transistor select signals in one-to-one correspondence with the foot transistors so that each foot transistor select signal affects switching of the corresponding foot transistor.

15. The memory device as set forth in claim 14, the memory device having an evaluation phase and a pre-charge phase where a read operation is performed during an evaluation phase, further comprising:

a domino gate to provide $2^n$ dynamic read select signals in one-to-one correspondence with the $2^n$ read select signals and the plurality of memory cells, so that each dynamic read select signal switches OFF the read-access transistor of the corresponding memory cell during a pre-charge phase, and switches ON the read-access transistor of the corresponding memory cell during an evaluation phase only if performing a read operation on the corresponding memory cell.

16. The memory device as set forth in claim 15, wherein each local bit line select signal keeps the corresponding pullup transistor ON during an evaluation phase only if no read operation is performed on the corresponding set of $2^{n-m}$ memory cells.

17. The memory device as set forth in claim 14, wherein the decoder comprises:

a post-decoder responsive to the $2^m$ local bit line select signals and the n-bit address to provide the $2^n$ read select signals and the $2^{m+k}$ foot transistor select signals.

18. The memory device as set forth in claim 12, wherein k=0.

* * * * *

UNITED STATES PATENT AND TRADEMARK OFFICE
CERTIFICATE OF CORRECTION

PATENT NO. : 6,781,892 B2
DATED : August 24, 2004
INVENTOR(S) : Hsu et al.

It is certified that error appears in the above-identified patent and that said Letters Patent is hereby corrected as shown below:

Column 4,
Line 6, delete "MOSFET" and insert -- nMOSFET --.

Column 8,
Line 9, delete "in" and insert -- an --.

Column 9,
Line 36, delete "$2^{n-m}$" and insert -- $2^m$ --.

Column 10,
Line 40, delete "$2^{m+}$ foot" and insert -- $2^{m+k}$ foot --.

Signed and Sealed this

Third Day of May, 2005

JON W. DUDAS
*Director of the United States Patent and Trademark Office*